United States Patent
Yu et al.

(10) Patent No.: US 9,412,623 B2
(45) Date of Patent: Aug. 9, 2016

(54) METAL OXIDE TFT WITH IMPROVED SOURCE/DRAIN CONTACTS AND RELIABILITY

(71) Applicants: Gang Yu, Santa Barbara, CA (US); Chan-Long Shieh, Paradise Valley, AZ (US); Tian Xiao, Santa Barbara, CA (US); Fatt Foong, Goleta, CA (US)

(72) Inventors: Gang Yu, Santa Barbara, CA (US); Chan-Long Shieh, Paradise Valley, AZ (US); Tian Xiao, Santa Barbara, CA (US); Fatt Foong, Goleta, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 14/833,462

(22) Filed: Aug. 24, 2015

(65) Prior Publication Data

US 2016/0056297 A1   Feb. 25, 2016

Related U.S. Application Data

(60) Continuation-in-part of application No. 14/175,521, filed on Feb. 7, 2014, now Pat. No. 9,117,918, which is a division of application No. 13/155,749, filed on Jun. 8, 2011, now Pat. No. 8,679,905.

(51) Int. Cl.

| | |
|---|---|
| *H01L 21/383* | (2006.01) |
| *H01L 29/786* | (2006.01) |
| *H01L 29/49* | (2006.01) |
| *H01L 29/66* | (2006.01) |
| *H01L 23/00* | (2006.01) |
| *H01L 21/8234* | (2006.01) |

(Continued)

(52) U.S. Cl.
CPC ............ *H01L 21/383* (2013.01); *H01L 21/321* (2013.01); *H01L 21/324* (2013.01); *H01L 21/428* (2013.01); *H01L 21/477* (2013.01); *H01L 21/47635* (2013.01); *H01L 21/823418* (2013.01); *H01L 23/564* (2013.01); *H01L 29/45* (2013.01); *H01L 29/4908* (2013.01); *H01L 29/66742* (2013.01); *H01L 29/66969* (2013.01); *H01L 29/7869* (2013.01); *H01L 29/78606* (2013.01); *H01L 29/78618* (2013.01); *H01L 29/78648* (2013.01); *H01L 29/78696* (2013.01)

(58) Field of Classification Search
CPC ...................... H01L 29/7869; H01L 29/78618; H01L 29/78696; H01L 21/321; H01L 21/324; H01L 21/383; H01L 21/47635; H01L 21/477; H01L 21/823418
See application file for complete search history.

(56) References Cited

U.S. PATENT DOCUMENTS

| | | | |
|---|---|---|---|
| 7,977,151 B2 * | 7/2011 | Shieh | H01L 29/7869 257/E21.414 |
| 7,977,675 B2 * | 7/2011 | Kawamura | H01L 27/1214 257/369 |

(Continued)

*Primary Examiner* — Joseph C Nicely
(74) *Attorney, Agent, or Firm* — Robert A. Parsons; Michael W. Goltry; Parsons & Goltry

(57) ABSTRACT

A method including providing a substrate with a gate, a layer of gate insulator material adjacent the gate, and a layer of metal oxide semiconductor material positioned on the gate insulator opposite the gate, forming a selectively patterned etch stop passivation layer and heating at elevated temperature in an oxygen-containing or nitrogen-containing or inert ambience to selectively increase the carrier concentration in regions of the metal oxide semiconductor not covered by the etch stop layer, on which overlying and spaced apart source/drain metals are formed. Subsequently heating the transistor in an oxygen-containing or nitrogen-containing or inert ambience to further improve the source/drain contacts and adjust the threshold voltage to a desired level. Providing additional passivation layer(s) on top of the transistor with electric insulation and barrier property to moisture and chemicals in the surrounding environment.

30 Claims, 5 Drawing Sheets

(51) Int. Cl.
*H01L 21/4763* (2006.01)
*H01L 21/324* (2006.01)
*H01L 21/321* (2006.01)
*H01L 21/477* (2006.01)
*H01L 21/428* (2006.01)
*H01L 29/45* (2006.01)

(56) References Cited

U.S. PATENT DOCUMENTS

| | | | | |
|---|---|---|---|---|
| 8,273,600 B2* | 9/2012 | Shieh | ............... | H01L 29/7869 257/E21.461 |
| 9,117,918 B2* | 8/2015 | Shieh | ............... | H01L 21/428 |
| 2009/0294765 A1* | 12/2009 | Tanaka | ............... | H01L 29/7869 257/43 |
| 2011/0227065 A1* | 9/2011 | Shieh | ............... | H01L 29/7869 257/43 |
| 2012/0012840 A1* | 1/2012 | Korthuis | ............... | H01L 29/7869 257/43 |
| 2014/0001462 A1* | 1/2014 | Shieh | ............... | H01L 29/7869 257/43 |
| 2014/0346495 A1* | 11/2014 | Shieh | ............... | H01L 29/66742 257/43 |

* cited by examiner

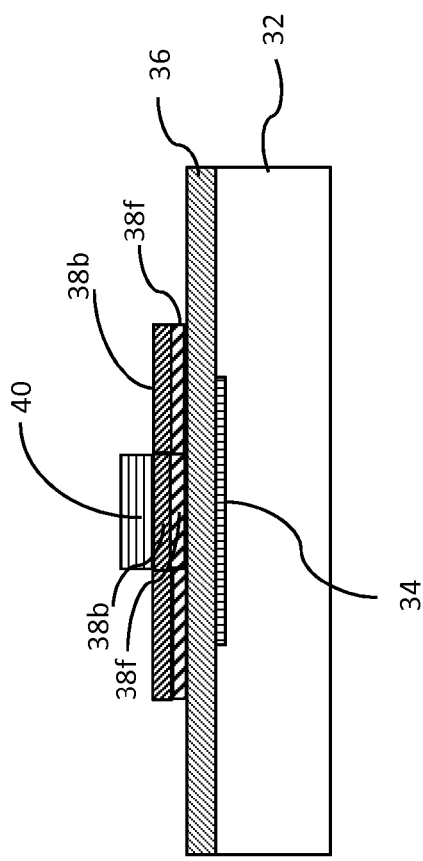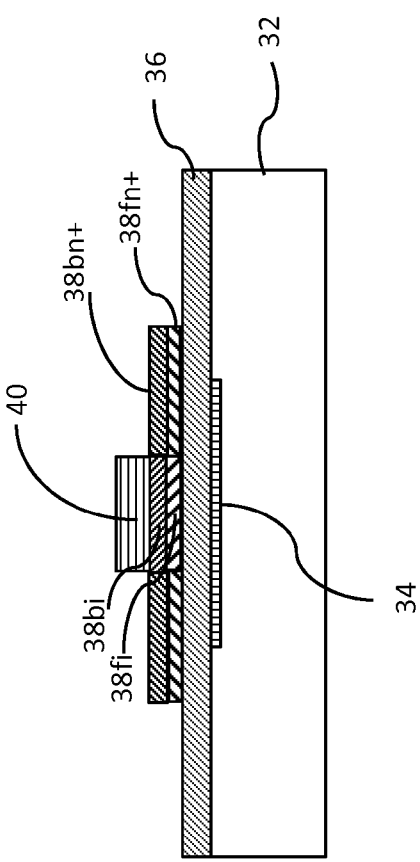

METAL OXIDE TFT WITH IMPROVED SOURCE/DRAIN CONTACTS AND RELIABILITY

CROSS-REFERENCE TO RELATED APPLICATIONS

This application is a continuation-in-part application of U.S. Pat. No. 8,679,905, issued Mar. 25, 2014 and co-pending application Ser. No. 14/175,521, entitled Metal Oxide TFT with Improved Source/Drain Contacts.

FIELD OF THE INVENTION

This invention generally relates to metal oxide TFTs and more specifically to forming an active layer with areas of different carrier densities whereby the source/drain contacts to the metal oxide semiconductor film are improved and the reliability of the metal oxide TFTs is enhanced.

BACKGROUND OF THE INVENTION

In the prior art, amorphous silicon (a-Si) thin film transistors are formed by depositing a first layer of a-Si semiconductor material over a gate and gate insulator layer and then depositing a layer of highly doped silicon (e.g. $n^+$ layer) on top of the first layer. Metal contacts for the source and drain are then formed on the highly doped layer defining a channel area in the first a-Si layer between the contacts. The highly doped layer over the channel area can then be etched away so as not to adversely affect the channel area. The low mobility in the a-Si TFT channel makes the device less demanding on contact resistance. The metal contacts formed on the highly doped area provide a low resistance (ohmic) contact.

In metal oxide thin film transistors (MOTFT) the source and drain metal contacts are formed directly on the metal oxide semiconductor layer. That is the metal oxide semiconductor material is the same under the source and drain metal contacts as it is in the channel area. For MOTFTs the lack of an $n^+$ layer and a higher bandgap makes it harder to provide a good ohmic contact. Furthermore, the high mobility of the metal oxide semiconductor material demands a lower contact resistance than in a-Si TFTs. Without a good, low resistance contact, hereinafter referred to as an ohmic contact, the high mobility of the metal oxide semiconductor material can be masked by the contact resistance. However, ohmic contacts in MOTFTs have been virtually unknown to date or are very difficult to form and/or retain, especially with a simple and manufacturing-friendly method.

It would be highly advantageous, therefore, to remedy the foregoing and other deficiencies inherent in the prior art.

Accordingly, it is an object of the present invention to provide new and improved source/drain to metal oxide semiconductor contacts in a MOTFT.

It is another object of the present invention to provide new and improved source/drain to metal oxide semiconductor contacts in a MOTFT that form low resistance ohmic contacts using a method which is relatively easy and inexpensive to implement during device fabrication.

It is also an object of the present invention to provide a process for fabricating a MOTFT from a uniform metal oxide semiconductor film of which portions in contact with the source/drain metal contacts have a carrier concentration greater than the carrier concentration in the channel area.

It is also an object of the present invention to provide an insulating, passivation layer shielding the MOTFT channel area, which passivation layer serves as a chemical barrier under TFT storage/operation conditions and during TFT fabrication process steps after the passivation layer. The as deposited passivation layer possesses sufficient mobility to oxygen at an elevated annealing temperature allowing turning carrier concentration and density of oxygen vacancy in the semiconductor channel area to desired ranges, and oxidizing the passivation layer to levels which resist to the chemicals experienced during the following deposition and etching process steps.

It is also an object of the present invention to provide an etch-stop/passivation layer over the metal-oxide semiconductor channel area, whose deposition process causes little or no damage to the underlying metal oxide semiconductor layer such that its carrier concentration is little changed after coating the etch stop passivation layer.

It is another object of the present invention to provide an insulating, passivation layer shielding the channel area, which passivation layer includes oxygen containing groups, and which serves as an oxygen source at annealing temperatures and serves as a chemical barrier at TFT storage/operation temperatures. When such passivation layer is positioned in between channel and source/drain electrodes, such passivation layer also function as an etch-stop during source/drain patterning stage.

It is another object of the present invention to provide an annealing process after which portions of the metal oxide semiconductor film not covered by the etch-stop/passivation layer exhibit a significant net loss of oxygen resulting in much higher carrier concentration than the portion of metal oxide semiconductor in the channel area which is covered by the etch stop/passivation layer, enabling low resistance ohmic contacts between source/drain electrodes and said portions of the metal oxide semiconductor film with much higher carrier concentration.

SUMMARY OF THE INVENTION

Briefly, the desired objects of the instant invention are achieved in accordance with a method of forming an active layer for a TFT with areas of different carrier densities which enables metal oxide TFTs with improved source/drain contacts and reliability.

The method includes the step of providing a substrate with a gate, a layer of gate dielectric insulator adjacent the gate, and a layer of metal oxide semiconductor material positioned on the gate dielectric insulator opposite the gate, a patterned passivation or etch stop layer covering part of the metal oxide semiconductor, with or without vacuum break between deposition of said passivation or etch stop layer and deposition of said metal oxide semiconductor, and annealing at an elevated temperature high enough to selectively increase the carrier concentration in regions of the metal oxide semiconductor layer not covered by the etch stop layer.

To further achieve the desired objects of the instant invention, provided is a method of forming ohmic source/drain contacts in a metal oxide semiconductor thin film transistor including providing a gate, a gate dielectric, a high carrier concentration metal oxide semiconductor active layer with a band gap and spaced apart source/drain metal contacts in a thin film transistor configuration. The spaced apart source/drain metal contacts define a channel region in the active layer. An oxidizing ambient is provided adjacent the channel region and the gate and the channel region are heated in the oxidizing ambient to reduce the carrier concentration in the channel area, optionally with simultaneous irradiation of UV light with preferred wavelength of 405 nm or shorter to help detach hydrogen from the various bonds in and around the metal oxide semiconductor active layer. Alternatively or in addition each of the source/drain contacts includes a very thin layer of low work function metal positioned on the metal oxide semiconductor active layer and a barrier layer of high work function metal is positioned on the low work function metal.

The desired objects of the instant invention are further achieved in accordance with one embodiment thereof wherein a metal to metal oxide low resistance ohmic contact in a metal oxide semiconductor thin film transistor includes a gate, a gate dielectric, a high carrier concentration metal oxide semiconductor active layer with a band gap and spaced apart source/drain metal contacts in a thin film transistor configuration. The spaced apart source/drain metal contacts define a channel region in the active layer. Portions of the metal oxide semiconductor active layer in contact with the source/drain metal contacts have a carrier concentration greater than a carrier concentration in the channel region.

The desired objects of the instant invention are further achieved in accordance with one embodiment thereof wherein a metal to metal oxide low resistance ohmic contact in a metal oxide semiconductor thin film transistor includes a gate, a gate dielectric insulator, a metal-oxide semiconductor active channel layer comprising a single layer, or bi- or multiple sub-layers with different chemical compositions, the top surface of the semiconductor metal-oxide layer is partially covered by a passivation or etch-stop layer, which is deposited with or without vacuum break from deposition of said metal oxide semiconductor channel layer, and an annealing process after which portions of the metal oxide semiconductor channel layer not covered by the passivation or etch stop layer exhibit significant net loss of oxygen resulting in much higher carrier concentration than the portion of metal oxide semiconductor layer in the channel area which is covered by the passivation or etch stop layer, enabling low resistance ohmic contact between source/drain metals and said portions of the metal oxide semiconductor layer with significantly higher carrier concentration. Where there is no vacuum break between the deposition of the passivation/etch-stop layer and deposition of metal oxide semiconductor layer, the interface between the two layers is thus kept pristine and free from any contamination, which assures superb device performance and reliability.

Alternatively or in addition to the above embodiment, a metal to metal oxide low resistance ohmic contact in a metal oxide semiconductor thin film transistor includes source/drain metal contacts with a very thin layer of low work function metal positioned on the metal oxide semiconductor active layer, the work function of the low work function metal being one of equal to and lower than a work function of the metal oxide semiconductor active layer, and a barrier layer of high work function metal positioned on the low work function metal, the work function of the high work function metal being one of equal to and greater than the work function of the metal oxide semiconductor active layer. Alternatively the layers of low work function metal and high work function metal can be replaced with a single layer in which the low work function metal and high work function metal are mixed in a sort of alloy.

It is worth noting that one common feature of all embodiments of this invention is that the passivation/etch stop layer serves as a chemical barrier under TFT storage/operation conditions and during TFT fabrication, especially during a source/drain patterning stage. The same passivation layer also possesses sufficient mobility to oxygen during annealing either before or after the formation of source and drain. In a preferred embodiment of the present invention, the etch stop passivation layer is deposited by a method that causes little or no damage to the underlying metal oxide semiconductor layer, for example by a solution process such as sol gel, or a CVD or PVD vacuum deposition process at low temperature, low power, and low plasma intensity near the film being deposited. During vacuum deposition of the etch stop passivation layer where a plasma is present in the vicinity of the film being deposited, it is advantageous to lower the power density and keep sufficient base pressure etc. to reduce the plasma intensity so that the damage to the underlying metal oxide semiconductor layer by ion bombardment or UV irradiation is minimized. Lower substrate temperature during vacuum deposition helps minimize the loss of oxygen from the metal oxide semiconductor layer during the formation of the etch-stop passivation layer, thereby reducing damage to the TFT channel.

In another preferred embodiment of the present invention, additional passivation layer(s) are deposited on top of the thin film transistor after completion of source/drain patterning, which help(s) protect the device from ambient moisture and chemicals. The additional passivation layer(s) include(s): SiNx, SiOxNy, AlN, Al2O3, SiAlON, TaOx, TiO2, and organic material such as polyimide, PMMA, PMGI, polysilane, polysiloxane, spin-on-glass, or commercially available photoresists used as planarization layer or bank layer in flat-panel field.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 2a illustrates the MOTFT before a high temperature anneal and FIG. 2b illustrates the MOTFT after a high temperature anneal;

FIGS. 3a and b are simplified layer diagrams of an example of a MOTFT with higher carrier concentration in portions of dual active layer metal oxide semiconductors not covered by passivation etch-stop layer, than in portion covered by passivation etch-stop layer, in accordance with the present invention, FIG. 3a illustrates the MOTFT before a high temperature anneal and FIG. 3b illustrates the MOTFT after a high temperature anneal;

DETAILED DESCRIPTION OF THE DRAWINGS

Figure 1:
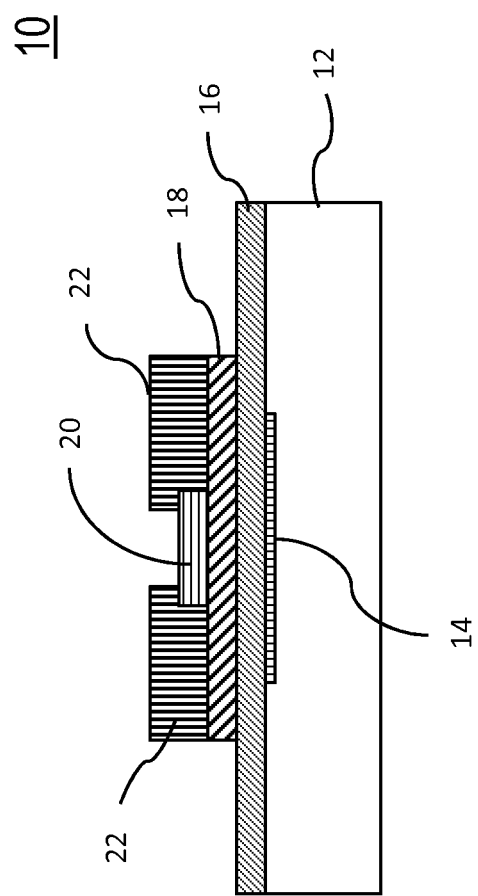
FIG. 1 is a simplified layer diagram of a prior art MOTFT with a passivation layer in the form of an etch-stop layer, with a uniform layer of metal oxide semiconductor under the etch-stop layer and under the source and drain contacts.

Turning now to FIG. 1, a simplified layer diagram of a prior art metal oxide TFT with a passivation layer in the form of island-type etch-stop layer and source-drain contacts is illustrated. TFT 10 includes a substrate 12 having a gate 14 formed in the upper surface thereof. Gate 14 is covered by a thin layer 16 of gate insulator (also called gate dielectric in the field) in a well-known fashion. A layer of metal oxide semiconductor 18 is formed on the upper surface of gate insulator layer 16 in any well-known fashion. Note that the carrier concentration in the metal oxide semiconductor layer 18 is uniformly distributed in this case.

In conventional metal oxide thin film transistors (MOTFT) the metal contacts are formed directly on the metal oxide semiconductor layer. That is, the metal oxide semiconductor material is the same under the metal contacts as it is in the channel area. For MOTFTs the lack of an $n^+$ layer and a larger bandgap make it harder to provide a good ohmic contact. Furthermore, the high mobility of the metal oxide semiconductor material demands a lower contact resistance than that in a-Si TFTs. Without a good ohmic contact, the high mobility of the metal oxide semiconductor material can be masked by the contact resistance.

In the prior art, the source and drain contacts in a MOTFT are usually the Schottky barrier type where metal is in direct contact with metal oxide semiconductor material. Generally, stable contact metals (e.g. Mo, W, Au, Pt, Ag, etc.) have a relatively high work function while metals with a low work function (e.g. Al, Mg, Ti, Ta, Zn, In, V, Hf, Y, etc.) are unstable or oxidize relatively easily. The high work function metals form a Schottky barrier with metal oxide semiconductor material and to provide conduction, carriers must tunnel through the barrier. If the barrier is thin tunneling can occur with only a small amount of resistance but if the barrier is thick tunneling may be nearly prevented. In either case the Schottky barrier contact is not as desirable as an ohmic contact with a low resistance.

Generally, there are two ways or methods to make a good ohmic contact between the metal oxide semiconductor and the source/drain (S/D) metal: 1) the carrier concentration of the metal oxide semiconductor at the interface with the S/D metal should be as high as possible; and/or 2) the work function of the S/D metal should substantially match the work function of the metal oxide semiconductor so there is little or no barrier for electron injection. However, each of these methods above has serious problems that must be overcome.

There is a dilemma in the device design for MOTFT. One problem is that the same high carrier concentration (e.g. $>10^{18}/cm^3$) metal oxide semiconductor material required for good ohmic contact to S/D also appears in the TFT channel area. For the TFT to operate properly, the channel carrier concentration cannot be too high (e.g. $<10^{18}/cm^3$) or else the TFT can not be fully pinched off, resulting in very negative threshold voltage and high off-current. Therefore, different carrier densities or concentrations must be created in different regions of the metal oxide semiconductor active layer of the TFT.

In U.S. Pat. No. 8,679,905 (4674-A23) and co-pending application Ser. No. 14/175,521 (4674-A23D), entitled Metal Oxide TFT with Improved Source/Drain Contacts, we presented a method to create low carrier density in the channel area and high carrier density in the S/D contact area with a high carrier density metal-oxide film at as deposited and patterned stage by proper annealing the MOTFT with a passivation/etch-stop layer possessing a Tg, above which can pass oxygen to channel area and reduce carrier density to level needed to switch off the MOTFT at zero bias.

In this application, two other examples of achieving different carrier densities or concentrations in different regions of the metal oxide semiconductor active layer are provided.

Figure 2A:
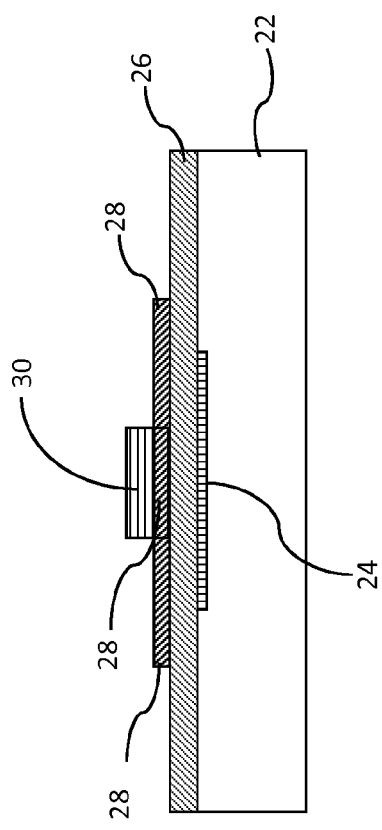
FIGS. 2a and b are simplified layer diagrams of an example of a MOTFT with higher carrier concentration in portions of single active layer metal oxide semiconductor not covered by passivation etch-stop layer, than in portion covered by passivation etch-stop layer, in accordance with the present invention.
Figure 2B:
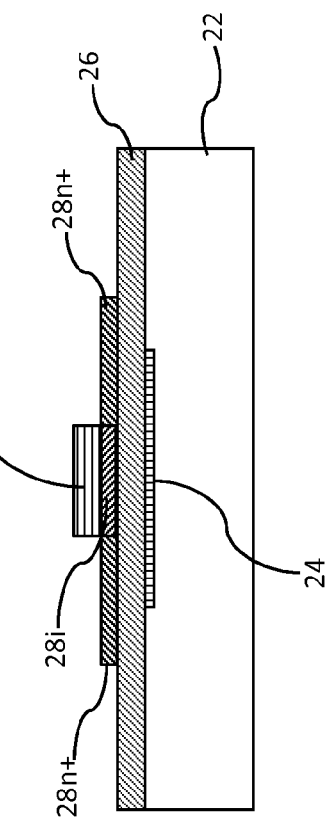

The first example of achieving different carrier densities or concentrations in different regions of the metal oxide semiconductor layer of a TFT is described in conjunction with FIGS. 2a and b. Here it will be understood that it is believed that any of the various possible MOTFT configurations could be adapted to the disclosed example including for example a bottom gate, bottom source/drain type of device, a top gate, top source/drain type of device, a top gate, bottom source/drain type of device, etc. In this case, as illustrated in FIG. 2a, TFT 20 includes a substrate 22 having a gate 24 formed in the upper surface thereof. Gate 24 is covered by a thin layer 26 of gate insulator in a well-known fashion. Instead of depositing a high carrier concentration metal oxide semiconductor active layer in the very beginning, only a medium carrier concentration (e.g., in range of $10^{12}$-$10^{18}$ carriers (electrons) per $cm^3$) metal oxide semiconductor layer 28 needs to be deposited and patterned, after which an oxygen-providing and oxygen-conducting inorganic passivation or etch-stop layer (30) is deposited and patterned. An annealing process at elevated temperature (for example in range of 200-500° C., preferably in 250-400° C.) is then carried out in an oxygen-containing and/or nitrogen-containing or an inert atmosphere, as shown in FIG. 2b, during which the oxygen diffusing in and out of the metal oxide semiconductor in the region (28i) covered by the passivation or etch-stop layer 30 essentially reaches an equilibrium with little or no net change in oxygen content and therefore little or no change in the carrier concentration in the channel region, however in the regions (28n+) not covered by the passivation or etch-stop layer (30), the rate at which oxygen escapes the metal oxide semiconductor far exceeds the rate at which oxygen diffuses into and gets bonded to the metal oxide semiconductor, resulting in a significant net loss of oxygen and thus significant increase in carrier concentration in the metal oxide semiconductor in these regions (28n+) after the high temperature anneal. Source and drain deposition is then carried out after this high temperature anneal, to make sure that a good ohmic contact is formed between S/D metal (not shown) and the highly conductive metal oxide semiconductor regions (28n+).

The second example of providing different carrier densities or concentrations in different regions of the metal oxide semiconductor layer of a TFT is described in conjunction with FIGS. 3a and b. Here it will be understood that it is believed that any of the various possible MOTFT configurations could be adapted to the disclosed example including for example a bottom gate, bottom source/drain type of device, a top gate, top source/drain type of device, a top gate, bottom source/drain type of device, etc. In this case, as illustrated in FIG. 3a, TFT 30 includes a substrate 32 having a gate 34 formed in the upper surface thereof. Gate 34 is covered by a thin layer 36 of gate insulator in a well-known fashion. Dual active layer (38f/38b) with high carrier concentration (e.g., $>10^{18}$ carriers per $cm^3$) metal oxide semiconductor 38f adjacent to the gate insulator 36, capped by a low carrier concentration (e.g., $<10^{17}$ carriers per $cm^3$) metal oxide semiconductor 38b on the back was deposited and patterned, after which an oxygen-providing and oxygen-conducting inorganic passivation or etch-stop layer (40) is deposited and patterned. An annealing process at elevated temperature (for example, in range of 200-500° C., preferably in 250-400° C.) is then carried out in an oxygen-containing or nitrogen-containing or an inert atmosphere, as shown in FIG. 3b, during which the oxygen diffusing in and out of the metal oxide semiconductor bi-layer in regions (38$fi$/38$bi$) covered by the passivation or etch-stop layer essentially reaches an equilibrium with little or no net change in oxygen content and therefore little or no change in the carrier concentration in the channel region, however in regions (38$fn$+/38$bn$+ bi-layer) not covered by the passivation or etch-stop layer, the rate at which oxygen escapes the metal oxide semiconductor far exceeds the rate at which oxygen diffuses into and gets bonded to the metal oxide semiconductor, resulting in a significant net loss of oxygen and thus significant increase in carrier concentration in the metal oxide semiconductor in these regions (38$fn$+/38$bn$+ bi-layer) after the high temperature anneal. Source and drain deposition is carried out after this high temperature anneal, to make sure that a good ohmic contact is formed between S/D metal (not shown) and the highly conductive metal oxide semiconductor regions (38$fn$+/38$bn$+ bi-layer).

The bi-layer channel arrangement can be expended into multiple sublayers in the metal-oxide semiconductor stack with high carrier density close to the interface with GI (36) and lowest carrier density near the interface with passivation layer (40). In U.S. Pat. No. 8,907,336 (4674-A16D) and U.S. Pat. No. 9,099,563 (4674-A16C), a class of stable metal-oxide semiconductor composite film was disclosed for the MOTFT channel layer. Such composite comprises a fraction of metal-oxide semiconductor with ionic metal-oxide bonds (denoted as XO) and a fraction of metal-oxide or quasi-metal-oxide insulator with covalent metal-oxide bonds (denoted as YO). Carrier density can be tuned by the ratio between YO and XO, and for a given composite with fixed X-to-Y ratio, carrier density can be tuned by varying oxygen and nitrogen composition. These materials can be used for the channel layer in single layer (FIGS. 2$a$ and $b$) or with multiple sub-layers (as shown in FIGS. 3$a$ and $b$).

It is worth noting that the gate insulator layers in FIGS. 2$a$ and $b$ and FIGS. 3$a$ and $b$ can be a hydrophilic or hygroscopic insulator material. During the step of heating at elevated temperature after forming patterned etch-stop layer, an accelerated oxidation process can be achieved by the hydrophilic or hygroscopic gate insulator which releases trapped water molecules at the gate insulator/channel interface, thus providing an additional source of oxygen. Examples of such hydrophilic or hygroscopic insulator materials include $SiO_2$:H, SiN:H, SiON:H, $Al_2O_3$:H, $HfO_2$:H, $ZrO_2$:H and their combinations in stack or in blend form.

The passivation/etch stop layer (30 in FIGS. 2$a$ and $b$ or 40 in FIGS. 3$a$ and $b$) serves as a chemical barrier under TFT storage/operation conditions and during TFT fabrication, especially during the source/drain patterning stage. The same passivation layer also possesses sufficient mobility to oxygen during annealing either before or after the formation of source and drain. Examples of such inorganic etch-stop/passivation layers include $SiO_2$, $SiON_x$, $Al_2O_3$, $Ta_2O_5$, $TiO_2$, MgO, $B_2O_3$, $ZrO_2$, $Y_2O_3$, $HfO_2$, $V_2O_5$, $Nb_2O_5$, $La_2O_3$, $Sc_2O_3$ and their combinations in stack or blend form.

In a preferred embodiment of the present invention, the etch stop passivation layer is deposited by a method that causes little or no damage to the underlying metal oxide semiconductor layer, for example by a solution coating process from a sol-gel, or from a solution comprising corresponding organometallic or organosilanal/organolsiloxanal molecules, a post-coating annealing is typically needed to convert the coating film to the targeting inorganic insulator. This annealing can be combined with the post etch-stop deposition annealing process The etch-stop/passivation layer can also be deposited by a CVD or PVD vacuum deposition process at low temperature, low power, and low plasma intensity near the film being deposited. During vacuum deposition of the etch stop passivation layer where a plasma is present in the vicinity of the film being deposited (for example in the case of PECVD or sputter deposition), it is advantageous to lower the power density, select proper base pressure and other means available in the available deposition equipment to reduce the plasma intensity so that the damage to the underlying metal oxide semiconductor layer by ion bombardment or UV irradiation is minimized. Lower substrate temperature during vacuum deposition helps minimize the loss of oxygen from the metal oxide semiconductor layer during the formation of the etch-stop passivation layer, thereby reducing damage to the TFT channel.

When a vacuum deposition process is chosen for the etch-stop/passivation layer, the deposition of the passivation/etch-stop layer and deposition of metal oxide semiconductor layer can be carried out without vacuum break. The interface between the two layers is thus kept pristine and free from any contamination. Such process flow can improve device performance and reliability. In practice, the deposition system for the corresponding layers can be an in-line or cluster sputtering system, and the sputter targets for inorganic insulator etch stop passivation layer and for metal oxide semiconductor layer are either placed in separate sputter chambers separated by a gate valve, or are placed in a single sputter chamber with proper shielding between the two targets to prevent cross-contamination. The non-vacuum-break can also be achieved between two different deposition tools or different type of tools such as between sputter and PECVD, by means of a vacuum-holding chamber on a transportation vehicle.

In certain applications with the MOTFT disclosed in this invention, additional insolating passivation layer(s) or structure are needed on top of the thin film transistor after completion of source/drain patterning. In addition to providing insulation over the MOTFT, such additional passivation help(s) protect the device from ambient moisture and chemicals. The additional passivation layer(s) include(s): $SiO_2$, $SiN_x$, $SiO_xN_y$, AlN, $Al_2O_3$, SiAlON, $TaO_x$, $TiO_2$, and organic material such as polyimide, PMMA, PMGI, polysilane, polysiloxane, spin-on-glass, or commercially available photoresists used as planarization layer or bank layer in flat-panel field. A class of organic/organometallic material known as SAM (self-assembled-monolayer) or surface adhesion promotor can also be used. The additional passivation layer can be in single layer form, or in stack form with two or multiple sub-layers. It is found that inorganic/organic or organo/inorganic bilayers or multilayer stacks comprising such pairs serve better passivation than a passivation structure with a single layer. A hydrophobic surface is preferred at the free-surface of the last passivation layer.

Typical materials used for the substrate 22 and 32 in FIGS. 2$a$ and $b$ and FIGS. 3$a$ and $b$ include glass, stainless steel with a surface insulation coating, and plastic sheet. They can be in either rigid or flexible form.

Typical materials used for the gate metal 24 and 34 in FIGS. 2$a$ and $b$ and FIGS. 3$a$ and $b$ include Mo, Al, Cu, Ti Nd, or their combinations in stack or in alloy blend.

To improve the ohmic contact and minimize the contact resistance between the metal oxide semiconductor material and the S/D metal, one could select the materials for the semiconductor channel layer(s) and the S/D metal layer to match their work functions. There is a dilemma in the device design. The problem is that a low work function metal that substantially matches the work function of the metal oxide semiconductor is very unstable and relatively quickly absorbs oxygen from the metal oxide. Thus, the contact metal becomes a poor conductor or insulating metal oxide at the interface and increases the contact resistance. A high work function stable metal generally has a work function much higher than the metal oxide semiconductor work function so that the junction becomes a Schottky barrier junction instead of a low resistance ohmic contact.

Figure 4:
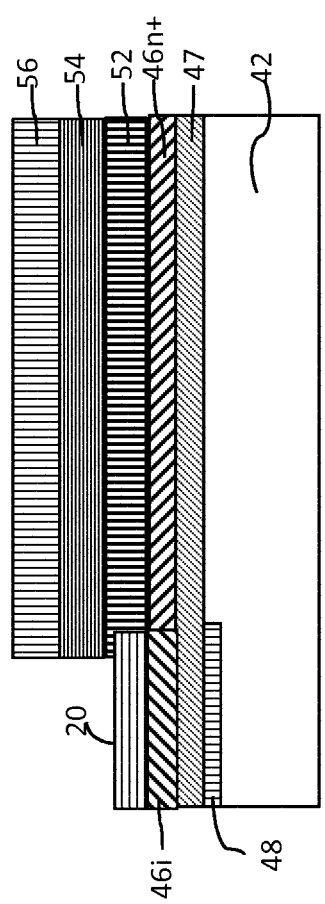
FIG. 4 is simplified layer diagram of a partial MOTFT illustrating an ohmic contact between source/drain multilayer metals and selectively reduced metal oxide semiconductor in accordance with the present invention.

A preferred way of solving this dilemma is illustrated in the simplified layer diagram of FIG. 4, showing a partial MOTFT 40 with an improved S/D to metal oxide semiconductor contact in accordance with the present invention. MOTFT 40 includes a substrate 42 with a gate metal electrode 48 formed therein. A thin layer 47 of gate insulator is formed over gate metal electrode 48 and at least partially over the upper surface of substrate 42. A layer of metal oxide semiconductor material is formed or patterned on the surface of layer 47, and is selectively reduced during an annealing process to form highly conductive regions 46n+ in areas not covered by etch stop passivation layer 20 and less conductive region 46i underneath the etch stop passivation layer 20. A S/D metal to metal oxide semiconductor ohmic contact is formed on the upper surface of metal oxide semiconductor layer 46n+. Here it will be understood that while a typical underlying gate and overlying source/drain type of MOTFT is illustrated, it is believed that any of the various possible MOTFT configurations could be adapted to the disclosed example including for example a bottom gate, bottom source/drain type of device, a top gate, top source/drain type of device, a top gate, bottom source/drain type of device, etc. Although single active layer 46 is shown in the example in FIG. 4, dual or multiple active layer metal oxide semiconductors such as that illustrated in FIGS. 3a and b could also be used.

It will be understood that typical metal oxide semiconductor materials described in this disclosure generally include at least one of zinc oxide, indium oxide, tin oxide, gallium oxide, cadmium oxide, or composites comprising their combinations. The composite metal-oxide disclosed in U.S. Pat. No. 8,907,336 (4674-A16D) and U.S. Pat. No. 9,099,563 (4674-A16C) provided another class of metal-oxide for the channel layer. The typical work function of these metal oxide semiconductors or metal-oxide composites is around −4 eV from vacuum (0 eV). For metals with work functions less than 4 eV, there is a strong tendency to form their metal oxides, which are relatively poor conductors. Some typical examples of low work function metals include Al, Mg, Ti, Ta, Zn, In, V, Hf, Y and alloys comprising them. Generally, the lower the work function, the less conductive their oxide tends to be, e.g. Mg has a work function of −3.5 eV, Al has a work function of −3.7 eV, and magnesium oxide and aluminum oxide are both relatively good insulators (or poor conductors).

Metal to metal oxide semiconductor (46n+) ohmic contact in FIG. 4 is a multiple metal contact that essentially solves the problem expressed above. A first very thin layer 52 of low work function metal is deposited on the surface of metal oxide semiconductor layer 46n+ to form a low resistance ohmic contact. Layer 52 is less than 5 nm thick and preferably less than 1 nm thick. A barrier layer 54 is deposited over layer 52 with a thickness greater than 10 nm and preferably greater than 50 nm. Examples of barrier metals that can be used include Mo, W, Au, Pt, Ag, Cu, Cr, Ni and alloys comprising them. Generally, the barrier metals have a high work function (e.g. 4.5 eV and greater) and are thus relatively stable metals. An optional bulk layer 56 of highly conductive contact metal, such as aluminum and copper, may be added on top of barrier layer 54 when the same metal layers are used for data and power lines in large size, high pixel count, active display or sensor arrays.

Thus, in the operation of metal to metal oxide semiconductor ohmic contact in FIG. 4, initially the very thin layer 52 of low work function metal forms an ohmic contact with metal oxide semiconductor layer 46n+. Because the low work function metal is unstable, oxygen from metal oxide semiconductor layer 46n+ relatively rapidly oxidizes it. The barrier metal layer of high work function metal (54) is included to block the further migration of oxygen from metal oxide semiconductor layer 46n+ into contact metal layer 56. It should be noted that layer 52 is so thin such that the amount of metal oxide accumulated from the oxidizing thereof has little or no effect on conduction of the contact. The combination of multi-layer S/D and selectively reduced metal oxide semiconductor ensures that during exposure of metal oxide TFT 40 to an oxygen-containing or nitrogen-containing or inert ambience at high temperature, the metal oxide semiconductor layer 46n+ under S/D contact will become even more conductive due to migration of oxygen into the low work function metal layer 52, which further improves the ohmic contact while enhancing the difference in carrier densities or concentrations in different regions of the channel layer.

In a slightly different embodiment, very small amounts of the low work function metal are alloyed or mixed into the metal of barrier layer 54, rather than forming a separate layer 52. Such an alloy or mixture still provides a low work function and good ohmic contact with the metal oxide semiconductor layer. An example of using such a low work function alloy, Mg—Ag, for the cathode in an organic light emitting diode was demonstrated by Kodak (C. W. Tang et al., *Applied Phys. Letters* 51, 913 (1987)), effective electron injection from the alloy cathode into organic semiconductor Alq layer was achieved.

In this embodiment, the low work function metal in the alloy adjacent the contact surface of metal oxide semiconductor material absorbs oxygen from the metal oxide semiconductor material, thus raising the carrier density or concentration and improving the metal to semiconductor contact. Since only a small amount of low work function metal is present the oxidation has little effect on the contact. Also, un-oxidized low work function material is shielded by the barrier metal so it has little effect on the contact.

The present invention provides new and improved low resistance ohmic source/drain metal contacts in a MOTFT. The improved source/drain metal contacts in a MOTFT form a low resistance ohmic contact that has not been previously readily achievable. Further, the improved source/drain metal contacts in a MOTFT are relatively easy and inexpensive to fabricate. It will be readily understood that either the process of selectively reducing the carrier concentration by high temperature annealing in oxygen-containing, or nitrogen-containing or inert atmosphere (i.e. providing different carrier densities or concentrations in different regions of the active layer) or the process of forming a multiple-layer S/D metal contact can be used separately or in combination if desired. The structure and the corresponding fabrication methods for the MOTFTs disclosed herein, in fact, provide an effective and simple way of forming zones in the metal oxide semiconductor layer with distinctly different carrier concentrations.

Figure 5B:
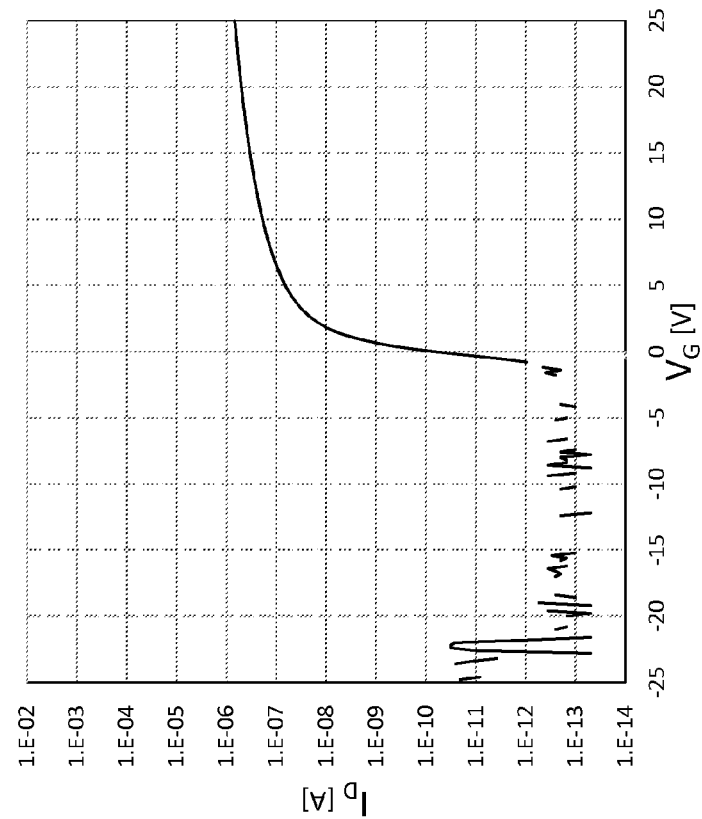
FIGS. 5a and b show examples of uniformly high carrier concentration in metal oxide semiconductor when performing the high temperature annealing before the etch-stop layer deposition and patterning (FIG. 5a), and selectively high carrier concentration in metal oxide semiconductor underneath s/d contacts when performing the high temperature annealing after the etch-stop layer deposition and patterning (FIG. 5b).
Figure 5A:
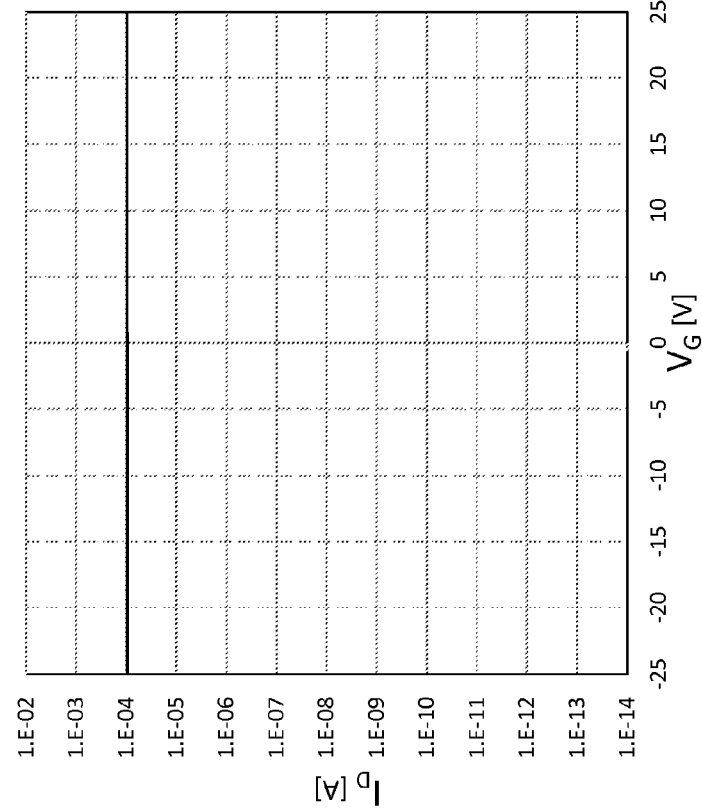

As an example, FIG. 5a shows the carrier concentration of a MOTFT made with an uniformly high carrier concentration in metal oxide semiconductor which was resulted from performing the high temperature annealing before the etch-stop layer deposition and patterning. The carrier density is uniform in the metal-oxide layer and is substantially higher than $10^{18}$ electrons/cm$^3$. No sign of current modulation even at Vgs=−30V. The capacitance of the GI layer used for this device is ~30 nF/cm$^2$, and the ability of charge modulation at $10^{19}$ electrons/cm3 is anticipated. The flat current at 0.1 mA under Vds=0.1V is consistent to such observation.

In contrast, when shifting the annealing process after forming the patterned etch-stop layer at the same temperature, under the same ambient environment, the channel current in the completed TFT can be switched off completely at ~0V. This fact implies that the carrier density in channel area is reduced to a level below ~$10^{17}$ electrons/cm$^3$. The contact resistance from I-V fitting reveals a number in 1-10 KΩ/μm range. For a MOTFT with channel width of 10 mm, the contact resistance is thus below 1 kΩ.

The MOTFT with improved metal-to-metal-oxide channel contact are especially important to TFTs with high mobility and high current switching ratio. For example, in an X-ray image array with 8000 scan lines and with 14-16 bits gray levels, TFT with switch ratio more than 10 orders of magnitude are required. For a display with 4000 scan lines and with 24000 display elements in each scan line, a TFT with mobility over 50 cm$^2$/Vsec is also required. The MOTFT disclosed in this invention enables displays and image arrays with high pixel counts and large dynamic range. These TFTs also enable driving circuits integrated in the peripheral area of an active display and image array. Such TFTs can be used for a variety of thin-film electronic applications including active matrix displays, image sensor arrays, touch sensor arrays, proximity sensing arrays, biosensor arrays, chemical sensor arrays and proximity sensing arrays and electronic arrays with multiple functionalities based on combinations above. The active displays comprise, but are not limited to, active matrix liquid crystal displays, active matrix organic light emitting displays, active matrix inorganic light emitting displays, active matrix electrophoretic displays, and active matrix MEMS (microelectromechanical system) displays Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of forming ohmic source/drain contacts in a metal oxide semiconductor thin film transistor comprising the steps of:
   providing a substrate with a gate, a layer of gate insulator adjacent the gate, and a layer of metal oxide semiconductor material positioned on the layer of gate insulator opposite the gate;
   forming a patterned etch stop passivation layer on selected portions of the layer of metal oxide semiconductor material defining source/drain areas and heating at an elevated temperature in an oxygen-containing or nitrogen-containing or inert ambience to selectively increase the carrier concentration in the source/drain areas of the metal oxide semiconductor layer not covered by the etch-stop layer;
   depositing overlying and spaced apart source/drain metals on the source/drain areas to make ohmic source/drain contacts in a thin film transistor configuration;
   subsequently heating the thin film transistor on the substrate in an oxygen-containing or nitrogen-containing or inert ambience to improve the source/drain contacts and adjust the threshold voltage to a desired level; and
   providing additional passivation layer(s) on top of the thin film transistor with electric insulation and barrier property to moisture and chemicals in the surrounding environment.

2. The method as claimed in claim 1 wherein the step of providing a layer of metal oxide semiconductor material includes providing a single layer metal oxide semiconductor with a carrier concentration in range of $10^{12}$-$10^{18}$ electrons/cm$^3$.

3. The method as claimed in claim 2 wherein the carrier concentration is in range of $10^{15}$-$10^{18}$ electrons/cm$^3$.

4. The method as claimed in claim 1 wherein the step of providing a layer of metal oxide semiconductor material includes providing a dual overlying sub-layer metal oxide semiconductor with a high carrier concentration ($10^{17}$-$10^{19}$/cm$^3$) in the sub-layer adjacent to the gate insulator and a low carrier concentration (<$10^{17}$/cm$^3$) in the sub-layer on top of the high carrier concentration layer.

5. The method as claimed in claim 1 wherein the step of providing a layer of metal oxide semiconductor material includes providing a multiple sub-layer metal oxide semiconductor with a high carrier concentration ($10^{17}$-$10^{19}$ electrons/cm$^3$) in a $1^{st}$ sub-layer adjacent to the gate insulator and a low carrier concentration (<$10^{17}$ electrons/cm$^3$) in a last sub-layer in contact with the passivation layer.

6. The method as claimed in claim 1 wherein the step of heating at elevated temperature after forming the patterned etch-stop layer is in range of 200-500° C.

7. The method as claimed in claim 6 wherein the step of heating at elevated temperature after forming the patterned etch-stop layer is in range of 250-400° C.

8. The method as claimed in claim 1 wherein the gate insulator includes hydrophilic or hygroscopic insulator materials, and the step of heating at elevated temperature after forming the patterned etch-stop layer includes an accelerated oxidation process assisted by the hydrophilic or hygroscopic gate insulator that releases trapped water molecules at the gate insulator/channel interface, thus providing an additional source of oxygen.

9. The method as claimed in claim 8 wherein the gate insulator includes at least one of $SiO_2$:H, SiN:H, SiON:H, $Al_2O_3$:H, $HfO_2$:H, $ZrO_2$:H and their combinations in stack or in blend form.

10. The method as claimed in claim 1 wherein the overlying and spaced apart source/drain metals further include metal contacts with a first portion including a low work function metal and a high work function barrier metal, the work function of the low work function metal being one of equal to and lower than a work function of the metal oxide semiconductor active layer, and the work function of the barrier material being one of equal to and greater than the work function of the metal oxide semiconductor active layer, the first portion being positioned on the metal oxide semiconductor active layer, and a second portion of high conductivity metal positioned on the first portion.

11. The method as claimed in claim 10 wherein the low work function metal has a work function lower than a work function of approximately −4 eV.

12. The method as claimed in claim 10 wherein the high work function barrier metal has a work function higher than a work function of approximately −4 eV.

13. The method as claimed in claim 10 wherein the low work function metal comprises Al, Mg, Ti, Ta, Zn, In, V, Hf, Y or alloy comprising them.

14. The method as claimed in claim 10 wherein the high work function metal comprises Mo, W, Au, Pt, Ag, Cu, Cr, Ni.

15. The method as claimed in claim 1 wherein the overlying and spaced apart source/drain metals further include metal contacts with a very thin layer with nominal thickness less than 5 nm of low work function metal positioned on the metal oxide semiconductor active layer, the work function of the low work function metal being one of equal to and lower than a work function of the metal oxide semiconductor active layer, and a barrier layer of high work function metal positioned on the low work function metal, the work function of the high work function metal being one of equal to and greater than the work function of the metal oxide semiconductor active layer.

16. The method as claimed in claim 1 wherein, during the step of heating the thin film transistor on the substrate in an oxygen-containing ambience, the source/drain metal contacts shield the contact portions of the metal oxide semiconductor active layer on each side of the channel region from the oxidizing ambience, whereby the contact portions on both sides of the channel portion retain the high carrier concentration.

17. The method as claimed in claim 1 wherein, during the step of heating the thin film transistor on the substrate in an oxygen-containing ambience, the etch stop passivation layer conveys oxygen therethrough to reach the active channel, thereby reducing its carrier concentration and moving the threshold voltage towards positive side.

18. The method as claimed in claim 17 wherein the etch stop passivation layer includes material containing oxygen, the oxygen being released during the heating steps during heating before and after source/drain electrodes forming to reach the active channel, thereby reducing its carrier concentration and moving the threshold voltage towards positive side.

19. The method as claimed in claim 1 wherein the etch-stop/passivation layer is an inorganic insulator.

20. The method as claimed in claim 19, wherein the inorganic insulator is selected from one of $SiO_2$, $SiON_x$, $Al_2O_3$, $Ta_2O_5$, $TiO_2$, MgO, $B_2O_3$, $ZrO_2$, $Y_2O_3$, $HfO_2$, $V_2O_5$, $Nb_2O_5$, $La_2O_3$, $Sc_2O_3$ and combinations thereof.

21. The method as claimed in claim 20, wherein the inorganic insulator is deposited by a coating process from a solution or sol gel comprising corresponding organometallic/organic molecules.

22. The method as claimed in claim 20, wherein the inorganic insulator is deposited by a low-temperature, low-power, low-plasma damage CVD or PVD vacuum deposition method.

23. The method as claimed in claim 22, wherein the CVD method includes PECVD or MOCVD.

24. The method as claimed in claim 22, wherein the PVD method includes sputter, e-beam or thermal deposition.

25. The method as claimed in claim 20, wherein the deposition of the inorganic insulator etch stop passivation layer and the deposition of the metal oxide semiconductor layer is carried out consecutively in a deposition system without breaking the vacuum.

26. The method as claimed in claim 25, wherein the deposition system is an in-line sputtering system, and the sputter targets for the inorganic insulator etch stop passivation layer and for the metal oxide semiconductor layer are either placed in separate sputter chambers separated by a gate valve, or are placed in a single sputter chamber with proper shielding between the two targets to prevent cross-contamination.

27. The method as claimed in claim 25, wherein the deposition system is a cluster sputter system, and the sputter targets for the inorganic insulator etch stop passivation layer and for the metal oxide semiconductor layer are placed in separate sputter chambers.

28. The method as claimed in claim 25, wherein the deposition system comprises different deposition units for the metal-oxide semiconductor layer and for the etch-stop/passivation layer, the non-vacuum-break process is achieved by means of a transportation vehicle comprising a load-lock, vacuum-holding chamber.

29. The method as claimed in claim 1 wherein the additional passivation layer(s) on top of the thin film transistor include(s) at least one of: $SiN_x$, $SiO_xN_y$, AlN, $Al_2O_3$, SiAlON, $TaO_x$, $TiO_2$, and organic material such as polyimide, PMMA, PMGI, polysilane, polysiloxane, spin-on-glass, SAM, surface promoters or photoresists used as planarization layer or bank layer used in display field.

30. The method as claimed in claim 29 wherein the additional passivation layer has a hydrophobic surface on a free-surface side.

* * * * *